US006525257B1

(12) United States Patent
Hermann

(10) Patent No.: US 6,525,257 B1
(45) Date of Patent: Feb. 25, 2003

(54) ARRANGEMENT PRESSURE POINT GENERATION IN KEYBOARDS FOR PIANO-LIKE KEYBOARD INSTRUMENTS

(76) Inventor: Ulrich Hermann, Theaterstrasse 3, D-99084 Erfurt (DE)

( * ) Notice: Subject to any disclaimer, the term of this patent is extended or adjusted under 35 U.S.C. 154(b) by 0 days.

(21) Appl. No.: 09/889,996

(22) PCT Filed: Nov. 22, 2000

(86) PCT No.: PCT/DE00/04138

§ 371 (c)(1), (2), (4) Date: Oct. 25, 2001

(87) PCT Pub. No.: WO01/39170

PCT Pub. Date: May 31, 2001

(30) Foreign Application Priority Data

Nov. 25, 1999 (WO) .............................. PCT/DE99/03734

(51) Int. Cl.[7] ............................ G10F 1/02; G10H 1/34; H03M 11/00

(52) U.S. Cl. .............................. 84/658; 84/688; 84/22; 341/32

(58) Field of Search .............................. 84/20–22, 115, 84/615, 626, 658, 688, 720, 721, 745, 746, DIG. 7; 341/32

(56) References Cited

U.S. PATENT DOCUMENTS 5,107,262 A 4/1992 Jean-Loup et al.
5,210,367 A * 5/1993 Taguchi et al. ............ 84/22 X
5,578,782 A 11/1996 Masubuchi
5,783,765 A * 7/1998 Muramatsu ............... 84/688 X
5,922,983 A 7/1999 Muramatsu
6,111,174 A * 8/2000 Oba et al. ...................... 84/21

FOREIGN PATENT DOCUMENTS

| | | |
|---|---|---|
| DE | 42 23 739.4 | 1/1994 |
| DE | 297 03 142 | 5/1997 |
| EP | 0 567 024 | 10/1993 |

* cited by examiner

*Primary Examiner*—Stanley J. Witkowski
(74) *Attorney, Agent, or Firm*—Collard & Roe, P.C.

(57) ABSTRACT

The invention relates to an arrangement, with which pressure point characteristics can be simulated, such that a key stroke typical of a cembalo, as well as the key characteristics of an organ can be as near as possible approached and permits the replication of a dynamic key stroke, as well as multiple pressure points during a single key operation. At least one sensor (3) is rigidly arranged for each key (1), from which positional data, about the key, is sent to an analog signal preparation unit and a programmable analytical unit (6), which generates data for an externally connected digital signal processor (7). Each key is coupled to an electromagnet (2), which is controlled by the analytical unit, depending upon the positional data and a current program. The arrangement for the creation of pressure points in keyboards is suitable for piano-like electronic keyboard instruments, electronic cembalos and electronic organs.

13 Claims, 7 Drawing Sheets

Figure 1:
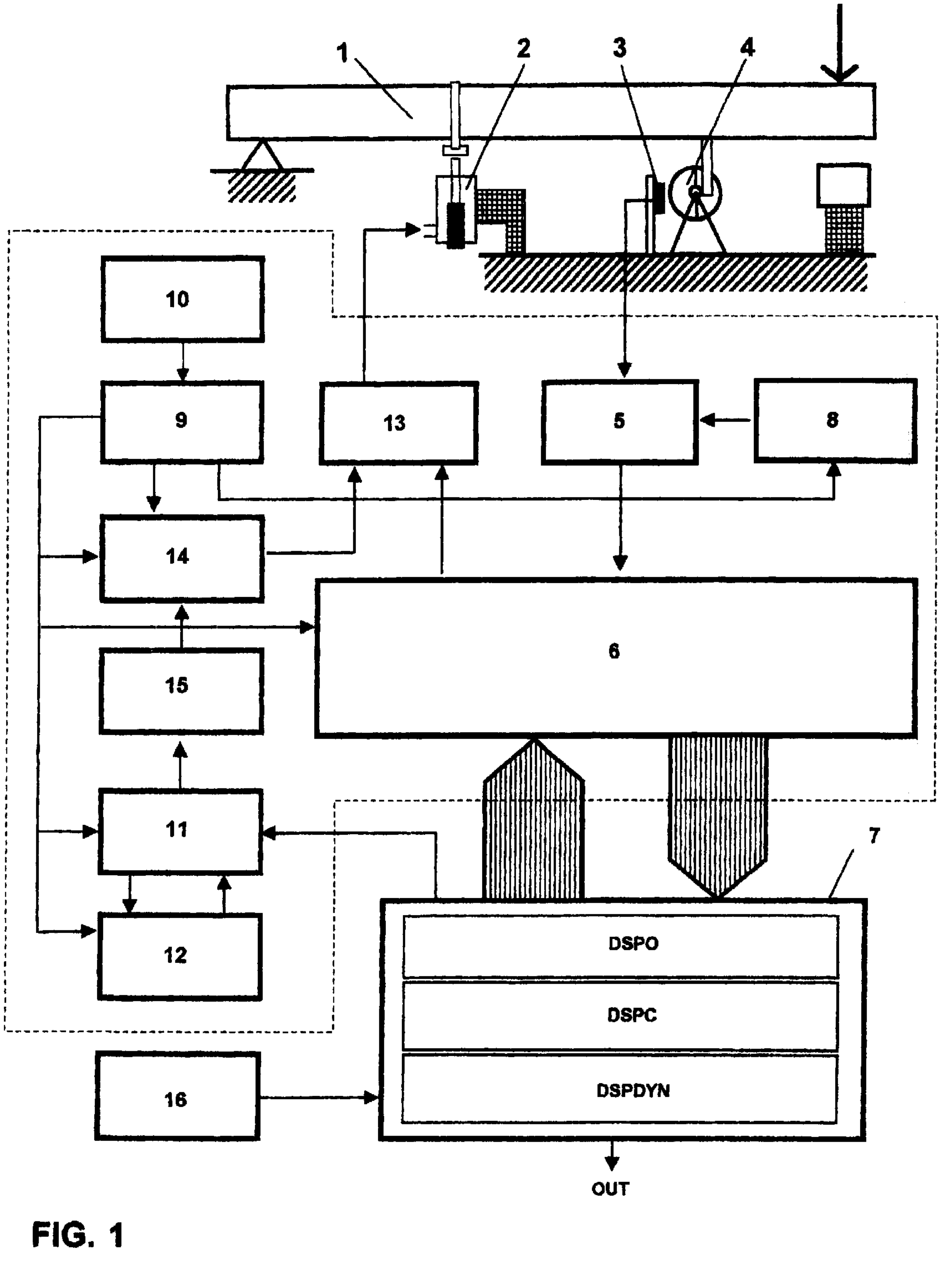
Figure 2A:
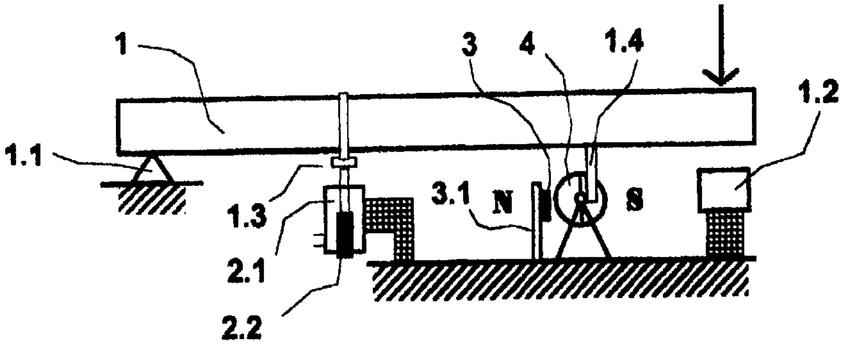
Figure 2B:
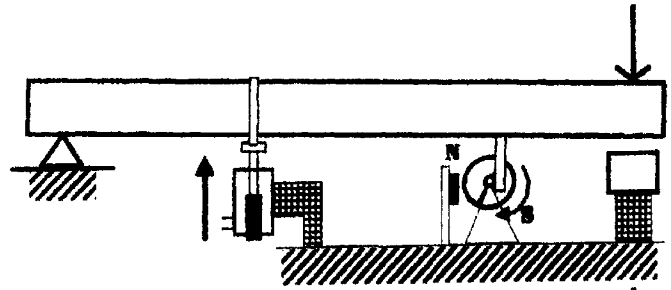
Figure 2C:
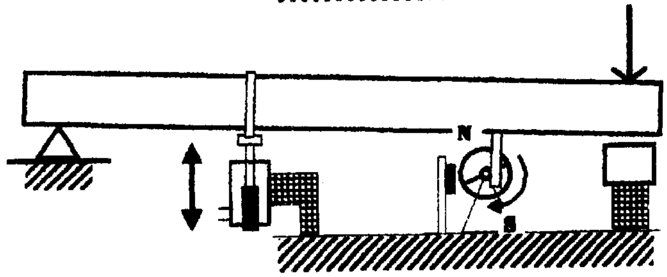
Figure 2D:
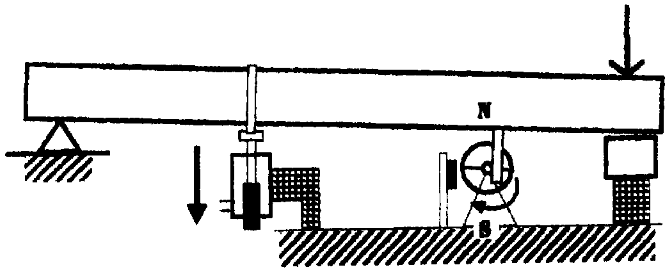
Figure 2E:
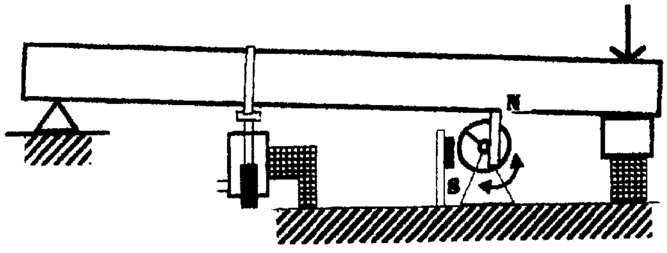
Figure 2F:
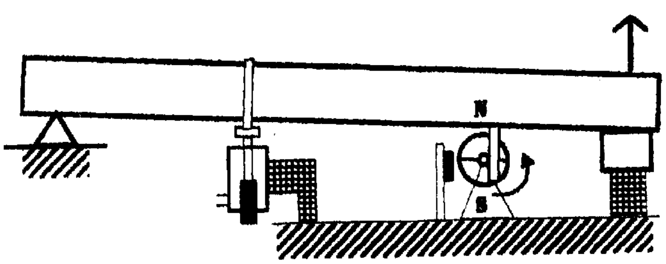

ARRANGEMENT PRESSURE POINT GENERATION IN KEYBOARDS FOR PIANO-LIKE KEYBOARD INSTRUMENTS

CROSS REFERENCE TO RELATED APPLICATIONS

Applicants claim priority under 35 U.S.C. §119 of German Application No. PCT/DE99/03734, filed on Nov. 25, 1999. Applicants also claim priority under 35 U.S.C. §120 of PCT/DE00/04138, filed on Nov. 22, 2000. The international application under PCT article 21(2) was not published in English.

The invention relates to an arrangement for pressure point generation in keyboards for piano-like electronic keyboard instruments, especially in keyboards for electronic harpsichords and electronic organs, by means of which sensors are controlled when key levers are actuated, and in which, to generate pressure points, key levers are connected to a scanning device, consisting of a sensor and a key magnet.

Background Art includes several disclosed pressure point devices in keyboards for piano-like keyboard instruments in which a pressure point is produced mechanically or magnetically.

EP 0 567 024 B1 indicates a device in which two permanent magnets are arranged in a homopolar position with regard to one another, so that the fact of overcoming the repulsive magnetic field is felt like a tactile touch when the magnets are led past one another.

In an arrangement described in DE 42 23 739.4 A1, an electromagnet is set against a permanent magnet for pressure point generation. The drawback of this arrangement is the fact that the electromagnetic counter magnet has only a limited efficacy, and that the arrangement makes manufacturing expensive.

Although they allow an adjustment to a specified condition, the disclosed devices do not allow a modification of their parameters while they are being used. Another drawback is the fact that the insertion into the permanently existing magnetic field does only enable relatively soft transitions.

U.S. Pat. No. 5,922,983 describes the emulation of force-relevant mechanical processes in a grand piano or piano keyboard when actuating the keys, in which a processor uses predefined curve shapes and the key movement data acquired by a key sensor to control an electromagnet assigned to the key. Although this makes it possible to emulate the playing touch of a simulated piano keystroke, this device does not allow the emulation of the essentially different touch and feel of a pipe organ manual, or of a multi-section harpsichord. It is not possible to simulate several different types of instruments using a single device.

Keyboards for electronic keyboard instruments with keystroke dynamics in which the key passage speed is evaluated between two contacts have also been disclosed as part of Background Art. But these keyboards do not allow the emulation of a typical piano keystroke manner in which a key is pressed slowly at the beginning, and accelerated at the end to strike a still relatively loud tone. It would also be desirable to be able to simulate the tactile touch in a way which is as close as possible to the touch characteristics applicable to the opening and closing of the wind-chest valve in a pipe organ. By analogy to the actuation of the pipe organ, the increase in the tactile-touch impression should also be felt when switching in several organ stops, with the tactile touch occurring in a relatively spontaneous way. It should also be possible to enable a tactile feedback simulating the pulling of the strings on a multi-section harpsichord.

It is the object of the invention to provide an arrangement of the kind mentioned at the beginning which allows the simulation of a tactile touch behaviour that comes as close as possible both to a keystroke typical of a harpsichord, and to the touch characteristics of an organ, and that also allows a dynamic keystroke as well as the emulation of several pressure points during one key operation.

In accordance with the invention, the object is achieved by an arrangement which presents the characteristics indicated in claim 18.

Advantageous embodiments are indicated in the subordinate claims.

The arrangement according to the invention provides a comparatively simple circuit-engineering arrangement, allowing the simulation of varied types of play. It is a particular advantage that several pressure points can be adjusted electrically in terms of strength, position, and length. In this context, it is possible to generate the point in a pulsed shape with a fast rise, or with a rise that is formed by any curve. Different parameters may be selected for pressing and releasing the key. Furthermore, it is possible to assign different sound generators to the keyboard.

Figure 3C:
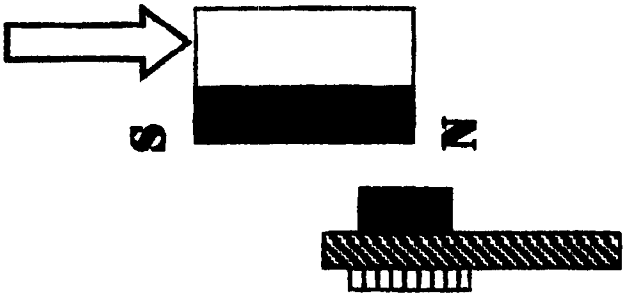
Figure 3B:
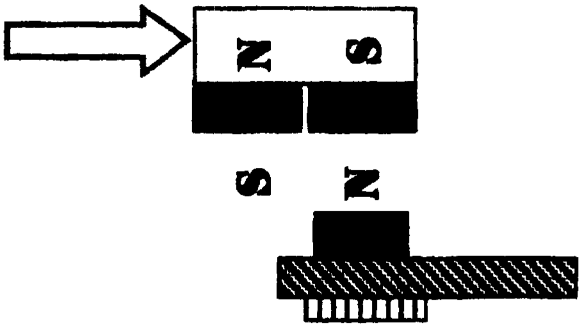
Figure 3A:
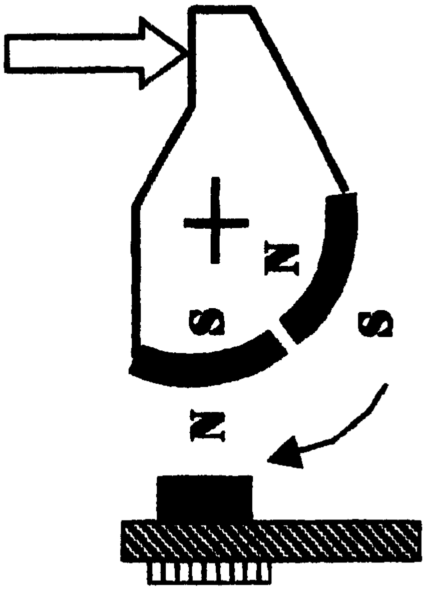
Figure 4:
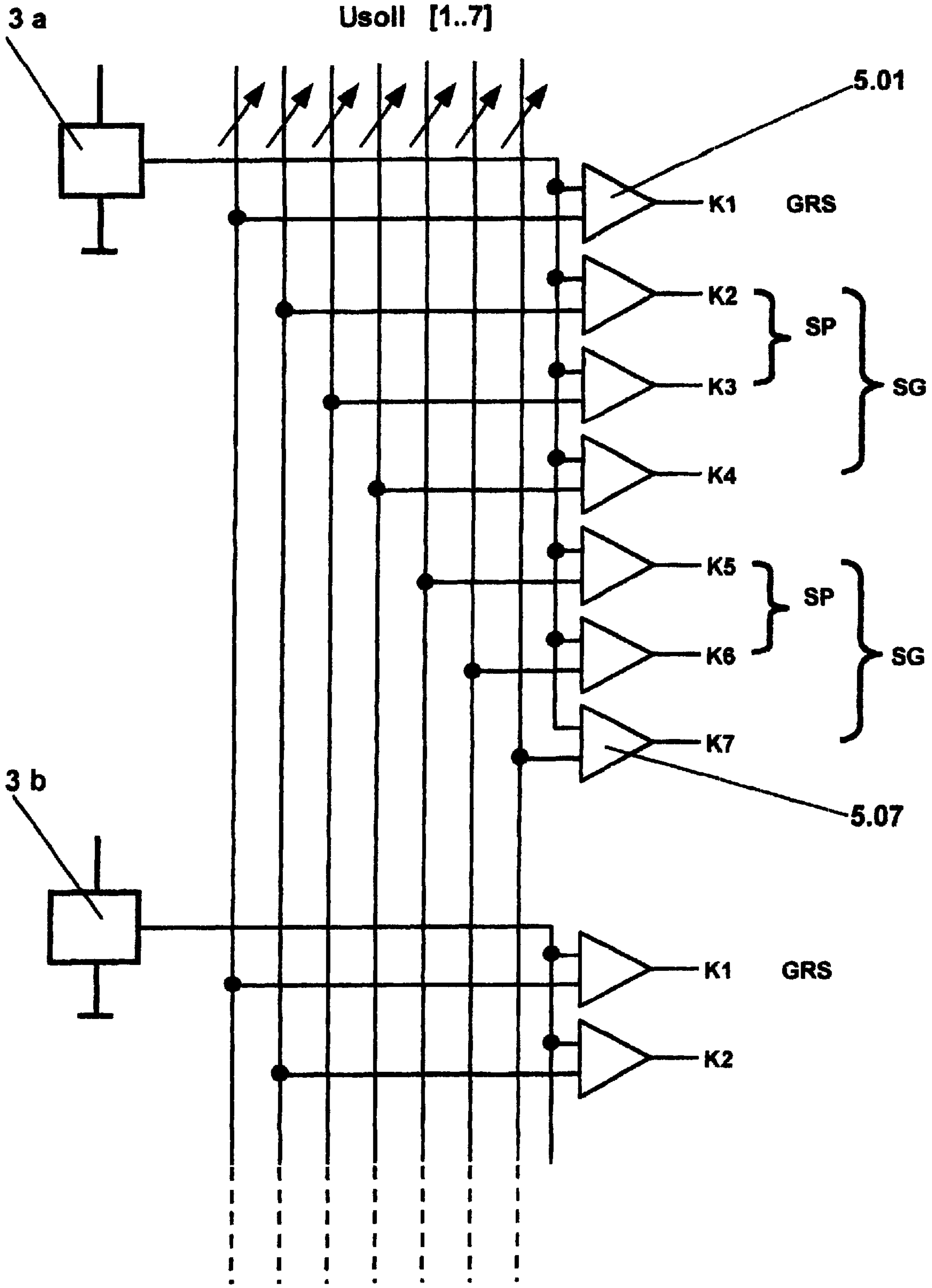
Figure 5:
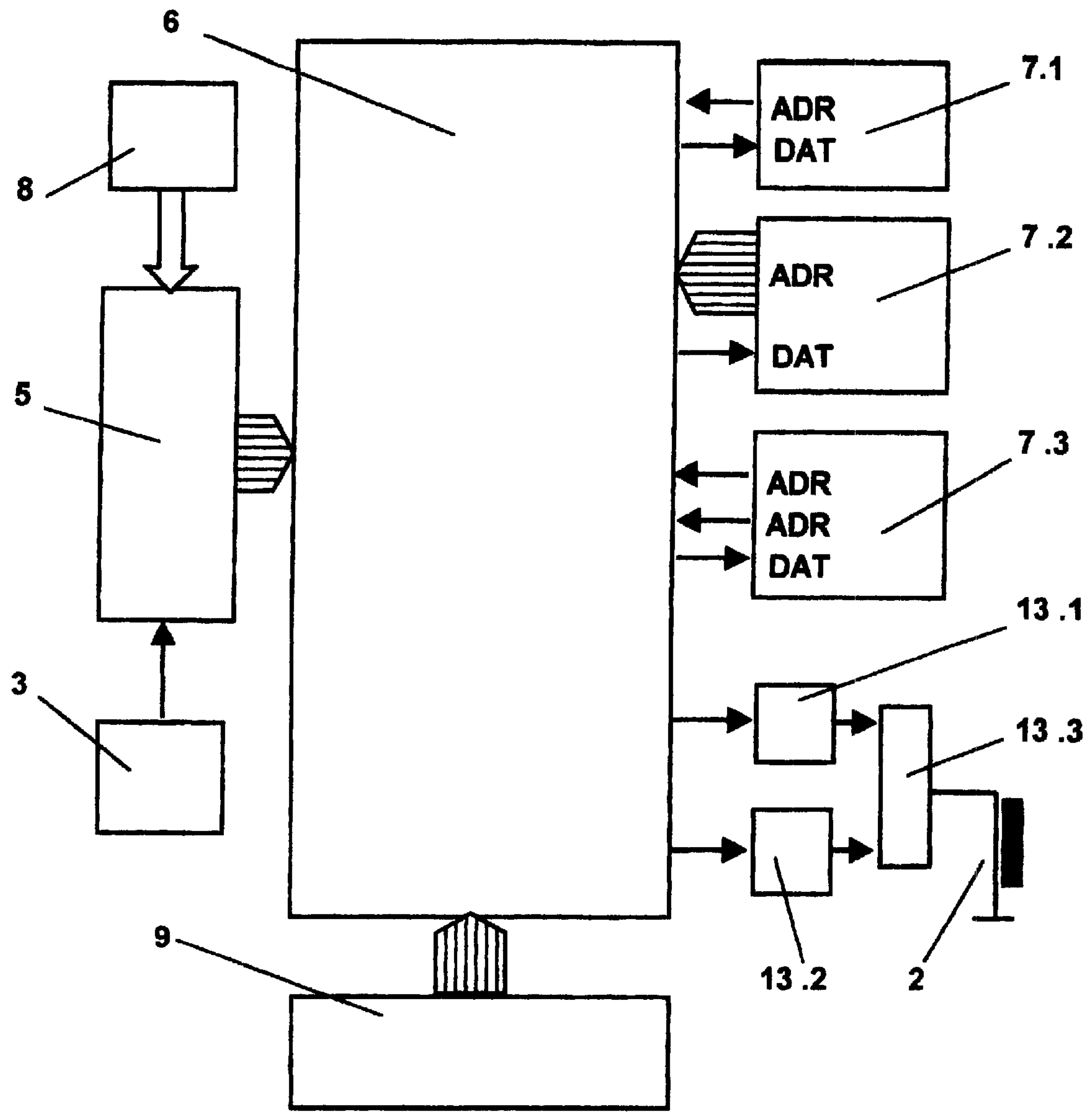
Figure 6:
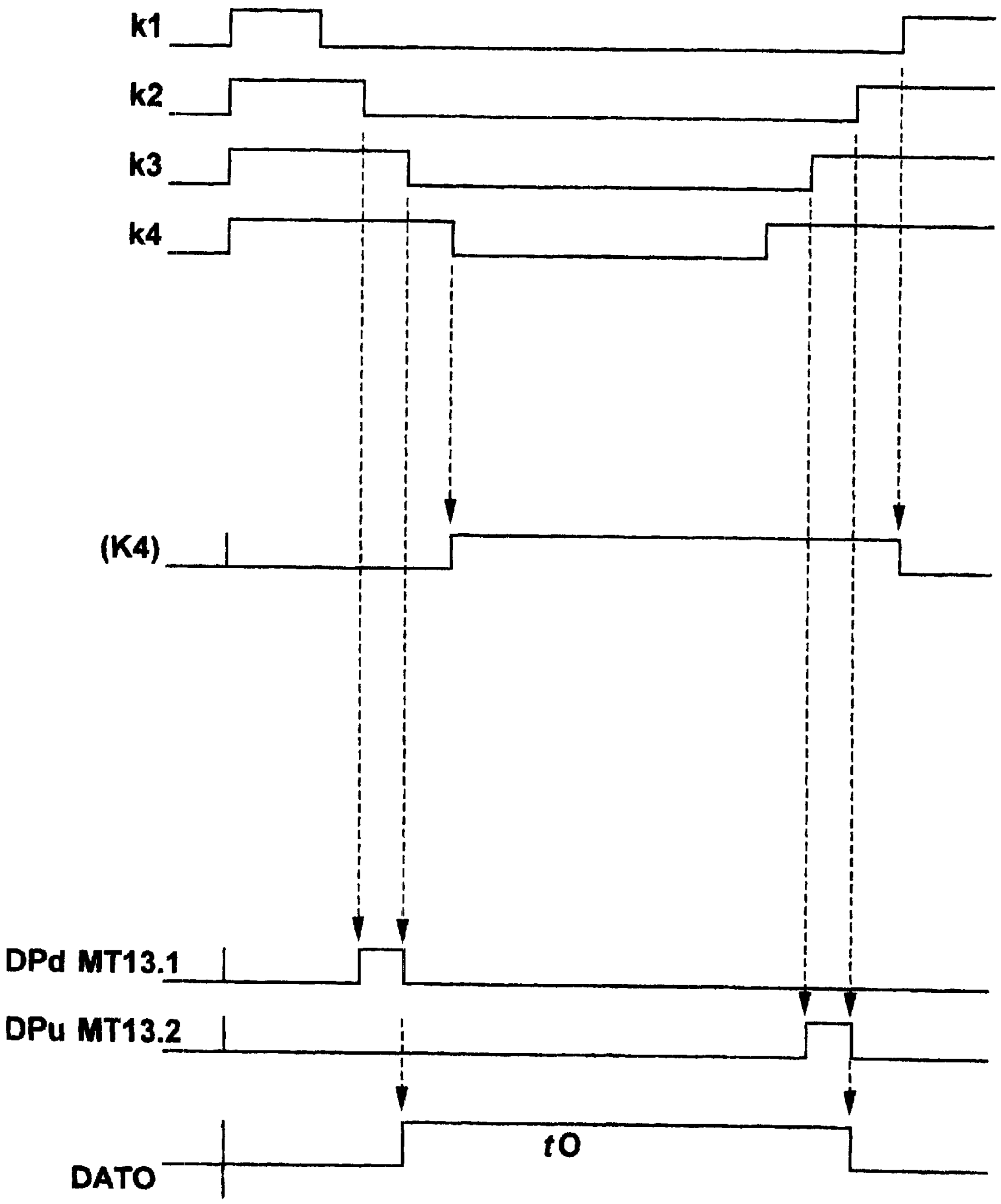
Figure 7:
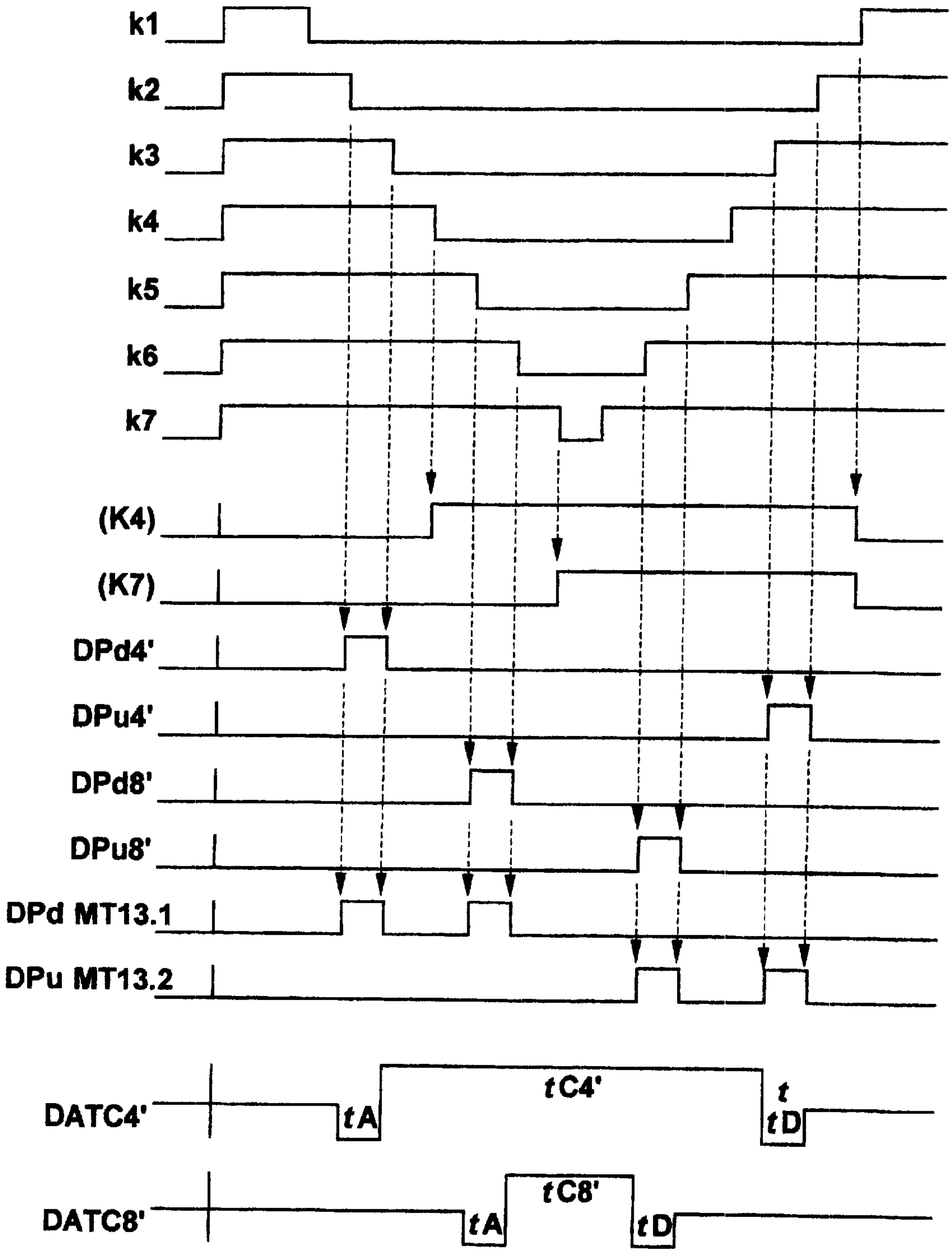

The invention will now be explained in detail with reference to an embodiment shown in the corresponding drawing, in which:

FIG. 1 is a diagrammatic view showing the mode of operation of an arrangement according to the invention, FIGS. 2*a*–2*f* are views showing the phase sequence during the actuation of a key lever, FIGS. 3*a*–3*b* are views of different embodiments for the arrangement of the sensor magnet, FIG. 4 is the block diagram of a comparator unit, FIG. 5 shows the mode of operation of the keyboard logic, FIG. 6 shows the shape of the switch pulses during a key operation with four switches, and FIG. 7 shows the shape of the switch pulses during a key operation for all seven switches.

FIG. 1 illustrates the mode of operation of the arrangement. A sensor 3 is assigned to every key lever 1, and fixed to the rack on a supporting plate 3.1. A plunger 1.4 is fixed to the key lever 1, and it transmits the key movement to the ring magnet 4. The lift of key is limited by the felt stop 1.2. The position data of the key lever 1 are transmitted to an analog signal conditioning unit by signals which are triggered by the sensor 3 during the passage movement of the ring magnet 4. In the example shown, this is a comparator unit 5, but it is also possible that an digital-to-digital converter is used as an analog signal conditioning unit. A programmable analyzing unit 6 is connected downstream of the analog signal conditioning unit, and it generates the data for digital signal processors 7 which are connected externally. The key lever 1 is coupled to the armature of an electromagnet 2. The electromagnet 2 is activated by the analyzing unit 6 after the evaluation of the position data, and depending on a current programming via the magnet driver 13.

The external digital signal processors (DSP) 7 are connected with the programmable analyzing unit 6. In this context, DSPO stands for a sound expander for organs, DSPL for a sound expander for harpsichords, and DSPDYN for a sound expander for dynamic keystrokes, for example, for a piano expander. In connection with the data field 9, the nominal voltage unit 8 controls the comparator unit 5. The data field 9 is connected with an external calculator 10 for data determination. An internal calculator 11 receives data from the data memory 12 which are fed to a digital-to-analog converter 15. The magnet driver 13 is controlled both by the voltage regulator unit 14, and by the programmable analyzing unit 6.

FIG. 2 shows phases a) through f) with the steps of the sequence of motions during the actuating operation of the key lever 1. The key lever 1 is supported in the pivot bearing 1.1, and maintained in the rest position shown in position a) by weights and springs not shown in the drawing. The key draught in the direction of the arrow is limited by the felt stop 1.2. The electromagnet 2 with coil form 2.1 and bar-wound armature 2.2 is positioned close to a contact surface 1.3 below the key. The contact surface 1.3 establishes the connection between key and bar-wound armature 2.2. The contact surface 1.3 has an advantageous adjustable design as a screw. The supporting plate 3.1, which is designed as a printed-circuit board with the sensor 3, is fixed to the keyboard rack. A permanent magnet in the form of a ring, the axle of which is connected to the keyboard rack, is shown as a sensor magnet 4. The ring magnet 4 presents two inversely magnetized semicircular segments. In the position shown in the drawing, the north pole of the magnet is directed toward the sensor 3. At this point, a maximum voltage is generated at the sensor 3 in one of its two possible current directions. The ring magnet 4 is supported in a turnable position on the rack, and it is rotated around its axis by the plunger 1.4 when pressing down the key lever 1 as shown in b), thus weakening the effect of the magnetic field on the sensor 3, so that this latter modifies its voltage. In this position, the electromagnet 2 is on, and it presses its bar-wound armature 2.1 from below against the key lever 1. By pressing the key further, overcoming the magnetic force of the electromagnet 2, the key reaches the disconnecting position of the electromagnet 2 as shown in FIG. 2*c*). The tactile touch point has now been overcome, and the key is being accelerated. In the position shown in phase d), the magnet 2 produces its weakest effect on the sensor 3, as neither the north nor the south direction is directed toward the sensor. In this case, the sensor 3 supplies half the operating voltage as in the unaffected condition. During a further key movement, the ring magnet 4 is turned further so that the opposite magnet direction is acting on the sensor 3. This position is shown in FIG. 2*e*). This generates the other current direction on the latter, and the operating voltage continues to fall. For the dynamic evaluation of the sensor data, a processor, which evaluates the analog voltage, is connected directly downstream of the sensor 3.

After the key lever 1 has reached the position d), the connection between plunger 1.4 and ring magnet 4 is released, and the magnet can move, rotating freely in an accelerating way. During this, it turns its south pole toward the sensor 3. The ring magnet 4 is moved back to the original position by appropriate resilient means or by magnets with an antipolar arrangement. This condition corresponds to the view shown in f). It is an advantage to load the magnet 4 with weights to generate a moment of inertia which can be felt in the key. The voltage amplitude generated by the spinning of the ring magnet 4 at the output of the sensor 3 is evaluated by the processor in such a way that either a voltage measurement or a time measurement is terminated at the moment of the falling amplitude, and that the data values reached are converted as valid into dynamic values.

FIGS. 3*a* through 3*c* show different versions for the arrangement of sensor magnets 4. The sensor 3 and a conducting iron 3.1 which increases the magnetic flux are arranged at the printed-circuit board 3.1. Circular segments of two antipolar magnets are provided in the arrangement shown in FIG. 3*a*. This device is similar to a hammer movement, and it only needs short movements, thus complying with weight loading. Two magnets are used also in the arrangement shown in FIG. 3*b*. In this case, two magnets with an antipolar arrangement are moving past the sensor 3 in a vertical direction. This arrangement is particularly suitable for piano and harpsichord play modes.

The arrangement shown in FIG. 3*c* requires only one magnet in a vertical polarity. This is easy to execute and well suited if an organ is played only.

FIG. 4 illustrates the design and mode of functioning of a comparator unit 5. The sensor 3*a* is assigned to a first key, and the sensor 3*b* is assigned to the next key. While the outputs of the sensors 3 are combined with the upper inputs of the comparators K1 . . . K7, the lower comparator inputs are connected to the lines of the nominal voltage bus to which the nominal voltages $U_{soll[1\ldots7]}$ are applied.

Another circuit state is generated by different nominal voltages in case of a modification in the sensor voltage at the outputs of the comparators at different times (key positions). The seven switches formed in this way are assigned to determined functions. The three switch groups SG are available for this. The comparators K2 through K4 and K5 through K7 are each forming one switch group SG. Every switch group SG consists of one switch pair SP and of one reversing switch with the comparator K4 or, correspondingly, K7. The comparator K1 is provided for all switches as a general reset in the rest state of the key, and it has the highest priority for all switches. The switch distances can be changed arbitrarily, taking account of the hierarchy saying that, within a switch group, the nominal voltage $U_{soll}$ is always higher or lower between one comparator and the next. It is even possible to shift the two switch groups so that they overlap or are pushed into an inverted position. A switch group becomes ineffective when it is shifted into the area outside of the sensor's voltage range.

FIG. 5 shows the function of the keyboard logic 6. The mode of operation of the sensor 3, comparator unit 5, nominal voltage unit 8, and data field 9 assemblies corresponds to the mode of functioning described above. The external digital signal processors 7 are applied with their address busses ADR and data lines DAT to the keyboard logic 6. The selection of the digital signal processor 7 to be activated is done via the data field 9. DSPOrgel 7.1, DSPCembalo 7.2, and DSPDYN(Piano) 7.3 are provided on an optional basis, i.e., they do not have a common data bus. This presents the advantage that different sound expanders can be activated by the keyboard, and that organ and piano can even be activated simultaneously. Two switch groups are available to imitate a two-section harpsichord. The above-mentioned relocatability of the switch groups allows a selection and an arrangement of the simulated string sections. If no stop has been pulled out in this way, no pressure point can be felt either. The time between two switching stages is evaluated for a dynamic keystroke type which is carried out on a frequent basis. This is done between the comparator-switch positions K3 and K5 in the case of the keyboard logic according to the invention. In a piano-organ combination, the organ sound is connected with the piano sound to the comparator K5 which is connected to the comparator K3 upon the termination of the tactile touch otherwise. The comparators K4 and K7 play a subordinate part in sound switching.

FIG. 6 shows the capture of the pressure points, and the sound use when playing in the organ mode. The switch positions of the comparators K1 through K4 are represented as symmetric stairs during a down key movement (down) and back up after the keystroke (up). The comparator K1 enables the sound channel through its low signal. The comparator K2 sets a flip-flop register FF, thus switching ON the down pressure point DPd for the magnet driver MT 13.1. After this, the comparator K3 resets and terminates the tactile touch time. A flip-flop register for the closing operation of the organ sound is set simultaneously. An active signal is applied to the organ data output DATO for the organ sound duration $t_O$ for DSPO. After this, the key draught reaches the switch position K4 which also causes a flip-flop register to be set that will only be reset by the comparator K1. This inverts the switch assignment for the up direction of key movement; as the comparator K3 now sets the flip-flop register and the comparator K2 resets. So, the organ sound $t_O$ ends in a hysteresis. Now, the pressure point signal appears as determined by the comparator K4 at the output DPu MT13.2, the pressure point up magnet driver. This means that the tactile-touch impression can be generally weaker or be switched off completely here, as both pressure point outputs can be activated separately. This generates a one-way pressure point The comparator K1 is in the H state when the key is in the rest position.

An essential special feature of the device is the fact that the number of the stops pulled out in an organ is mapped as a tactile touch weight which can be felt. The modifiable values fixed in the data memory 12 for the organ stops are added up in the calculator 11, and supplied via the digital-to-analog converter 15 to voltage regulation 14 for the magnet drivers 13. This generates a tactile touch weight depending on the stops. The same applies to manual coupling. This will give rise to the biggest force differences which can be sensed by the keyboard.

FIG. 7 shows the entire switch pulse staircase for comparators K1 through K7. This corresponds to the play mode of a double-section harpsichord. Both switch groups are activated. A 4-feet and an 8-feet string section is assumed. Usually, the strings located one above the other are not pulled synchronously but one after the other. This characteristic harpsichord feature is taken into account by a second pressure point of the same kind. The basic sequence corresponds to the sequence described according to FIG. 6 in the explanation of the pressure point capture for an organ. But the characteristics of an harpsichord present essential differences when compared to an organ. An harpsichord has only strings which fade away and hardly allow a dynamic keystroke. A typical resonance box sound is created when a cembalo key is struck in the proper sense, while this sound is emulated by special sound sample, and mixed into the sound sample $t_{C4'/8'}$ according to the duration of the fist tactile touch pulse $t_A$. For this reason, the tactile touch pulse is also output at the data output DATC, while it means less sound the longer it is. Only a spontaneous short pressure point pulse is suitable for representing this impact sound. Unlike the organ sound, the harpsichord sound $t_C$ is not terminated by the comparators K2 or, correspondingly, K5. In this case, the end occurs one switch before as the backward touch point initiation is the beginning of the very distinctive touchdown sound which ends with the damping of the string $t_D$, and generates quite a significant and characteristic repercussion with a rich overtone. All this required key-dependent information can be supplied by the device according to the invention, and be used by special harpsichord samples. Although they appear separated as stops, the acoustical noises and sounds are generated only by one key, so that the pressure point pairs are combined as well. So, four pressure points can be felt during one key movement. But, of course, the return pressure point DPu is assumed in a very much weaker form. As shown in FIG. 7, the sequence for the 8' stop is exactly the same as for the 4' stop. By shifting the switch groups, the 8' stop can also be played as an upper string section. The stop selection is made by programming the nominal voltages $U_{soll}$. As a pressure point is only generated by pulling the string on an harpsichord, the keyboard logic 6 outputs the pressure point for every pulled harpsichord stop. Playing in the harpsichord mode is only possible when the piano mode and the organ mode are switched off. But it is possible to play several modes for multi-manual keyboard instruments.

LIST OF REFERENCE SIGNS

1 Key lever
- 1.1 Pivot bearing
- 1.2 Felt stop
- 1.3 Contact surface
- 1.4 Plunger

2 Electromagnet
- 2.1 Coil
- 2.2 Armature
- 2.3 Bar-wound armature

3 Sensor
- 3.1 Supporting plate
- 3.2 Conducting iron

4 Sensor magnet
5 Comparator unit
6 Keyboard logic
7 External digital network signal processor (DSP)
8 Nominal voltage unit
9 Data field
10 External calculator for data determination
11 Internal calculator
12 Data memory
13 Magnet driver
14 Voltage regulator unit
15 Digital-to-analog converter
16 DPd pressure point down
17 DPu pressure point up
18 DATO organ data
19 DATC harpsichord data
MT Magnet driver data
$t_O$ Organ sound timing pulse
$t_C$ Harpsichord timing pulse
$t_A$ Timing pulse for action noise
$t_D$ Timing pulse for damper noise
4' Harpsichord 4 feet stop
8' Harpsichord 8 feet stop
$U_{soll}$ Nominal voltage
K Comparator
GRS General reset

What is claimed is:

1. A device for producing pressure points in keyboards for electronic keyboard instruments having a frame, the device comprising:

a) at least one key lever disposed on, and coupled to the frame;

b) at least one electromagnet coupled to said at least one key lever;

c) at least one rod shaped anchor coupled to said at least one electromagnet;

d) at least one contact surface coupled to said at least one rod shaped anchor and disposed on an underside said at least one key lever;

e) at least one rod shaped sensor magnet made from a permanent magnet, coupled to, and disposed below each of said at least one key lever, wherein said at least one rod shaped sensor magnet is movable along its rod axis when said at least one key lever is actuated;

f) at least one hall sensor coupled to the frame, and disposed adjacent to said at least one rod shaped sensor magnet, wherein said at least one rod shaped sensor magnet is guided free of contact adjacent to said at least one hall sensor;

g) at least one comparator unit in communication with said at least one hall sensor wherein said at least one rod shaped sensor magnet excites said at least one hall sensor wherein information relating to the position and time of said at least one key lever is transmitted by said at least one hall sensor to said at least one comparator unit, which converts analog position data into digital position data;

h) at least one programmable evaluation unit coupled downstream of said at least one comparator unit;

i) at least one digital signal processor coupled to said at least one programmable evaluation unit which generates data for said at least one digital signal processor; and j) at least one electromagnetic drive coupled to said evaluation unit and in communication with said at least one electromagnet, said at least one electromagnetic drive for controlling said at least one electromagnet to simulate a defined pressure point curve based upon an interpretation of said digital position data using a program when said at least one key lever is actuated.

2. The device as in claim 1, wherein said at least one contact surface is an adjusting screw.

3. The device as in claim 1, further comprising at least one data field and at least one external calculator, wherein said at least one programmable analyzing unit consists of a keyboard logic which is programmable via said at least one data field or said at least one external calculator wherein said at least one programmable analyzing unit assigns data for said at least one magnetic drive and said at least one externally connected digital signal processor.

4. The device as in claim 1, wherein said at least one magnetic drive contains two controllable amplifiers (13.1 and 13.2) which are assigned to a direction of key movement, wherein an output voltage of said amplifiers excites said at least one electromagnet via an OR relation.

5. The device as in claim 1, further comprising a controllable RC element for exciting and controlling said at least one electromagnet via a delay.

6. The device as in claim 1, further comprising a pulse width control for exciting and controlling said at least one electromagnet via a delay.

7. The device as in claim 1, wherein said at least one comparator unit comprises a plurality of analog comparators with each of said plurality of analog comparators having a first input and at least a second input, said first input being coupled to a voltage output of said at least one sensor, the device further comprising at least one nominal voltage unit for generating a programmable and regulable nominal voltage which is different for each input and applied differently to said at least a second input.

8. The device as in claim 1, further comprising a nominal voltage unit in communication with said at least one comparator unit, wherein said at least one sensor is coupled to said at least one comparator unit wherein this connection creates different switch points for different key positions by the determination of voltage values of a nominal voltage unit.

9. The device as in claim 1, wherein said programmable analyzing unit cornprising a keyboard logic has a calculator assigned to it which compares and evaluates data from said at least one digital signal processor, and wherein the device further comprising an external register input, and a data memory storage device for determining and selecting an evaluated set of data from a set of data in a data field.

10. The device as in claim 1, further comprising at least one voltage unit, at least one data field, at least one calculator and at least one digital to analog converter all in communication with each other and wherein said programmable analyzing unit comprises a keyboard logic for switching said at least one magnetic drive and wherein said voltage unit controls said magnetic drives via a drive voltage.

11. The device as claimed in claim 1, wherein said at least one comparator unit comprises seven analog comparators wherein each of said seven analog comparators are coupled to at least one sensor wherein said seven analog comparators form three switch groups with a first switch group and a second switch group each comprising three comparators which are used as a set, a reset and an inverter device respectively, and a third switch group comprising one switch which is used as a general reset.

12. A device for producing pressure points in keyboards for electronic keyboard instruments having a frame, the device comprising:

a) at least one key lever disposed on, and coupled to the frame;

b) at least one electromagnet coupled to said at least one key lever;

c) at least one rod shaped anchor coupled to said at least one electromagnet;

d) at least one contact surface each coupled to said at least one of said at least one rod shaped anchor and disposed on an underside of each of said at least one key lever;

e) at least one rotatable element having a sensor magnet made from a permanent magnet, coupled to, and disposed below said at least one key lever;

f) at least one tappet coupled to said at least one key lever said at least one tappet putting said at least one rotatable element into rotatable motion when said at least one key lever is actuated wherein said at least one rotatable element is detached from said at least one tappet when a speed of said at least one key is sufficiently high;

g) at least one hall sensor coupled to the frame, and disposed adjacent to said at least one rotatable element having a sensor magnet, wherein said at least one rotatable element is guided free of contact adjacent to said at least one hall sensor;

h) at least one comparator unit in communication with said at least one hall sensor wherein said at least one rotatable element excites said at least one hall sensor wherein information relating to the position and time of said at least one key lever is transmitted by said at least one hall sensor to said at least one comparator unit, which converts analog position data into digital position data;

i) at least one programmable evaluation unit coupled downstream to said at least one comparator unit;

j) at least one digital signal processor coupled to said at least one programmable evaluation unit which generates data for said at least one digital signal processor; and k) at least one electromagnetic drive coupled to said evaluation unit and in communication with said at least one electromagnet, said at least one electromagnetic drive for controlling said at least one electromagnet to simulate a defined pressure point curve based upon an interpretation of said position data using a program when said at least one key lever is actuated.

13. The device as in claim 12, wherein said at least one programmable analyzing unit is a calculator.

* * * * *